United States Patent [19]
Hoffarth et al.

[11] Patent Number: 5,745,334
[45] Date of Patent: Apr. 28, 1998

[54] CAPACITOR FORMED WITHIN PRINTED CIRCUIT BOARD

[75] Inventors: Joseph Gerard Hoffarth, Binghamton; John Matthew Lauffer, Waverly, both of N.Y.; Issa Said Mahmoud, deceased, late of Austin, Tex., by Jane C. Mahmoud, legal representative

[73] Assignee: International Business Machines Corporation, Armonk, N.Y.

[21] Appl. No.: 625,423

[22] Filed: Mar. 25, 1996

[51] Int. Cl.$^6$ .......................... H01G 4/008; H01G 4/06
[52] U.S. Cl. .......................... 361/313; 361/312; 361/303; 361/305; 361/306.3; 361/763; 361/760; 361/751
[58] Field of Search .......................... 361/311, 312, 361/313, 321.2, 321.5, 306.1, 306.3, 735, 736, 757, 751, 760, 763, 761; 291/25.42

[56] References Cited

U.S. PATENT DOCUMENTS

| | | |
|---|---|---|
| 3,699,011 | 10/1972 | Nishimura . |
| 4,460,938 | 7/1984 | Clei . |
| 4,749,449 | 6/1988 | Scott . |
| 5,027,253 | 6/1991 | Lauffer et al. . |
| 5,079,069 | 1/1992 | Howard et al. . |
| 5,161,086 | 11/1992 | Howard et al. . |
| 5,172,304 | 12/1992 | Ozawa et al. . |

FOREIGN PATENT DOCUMENTS 166616  10/1987  Japan .

OTHER PUBLICATIONS

IBM Technical Disclosure Bulletin vol. 22, No. 6, Nov. 1979, "Raw Card Composite Capacitor".
Thin Film Materials Research., Giannelis et al, Nov. 1993.

Primary Examiner—Leo P. Picard
Assistant Examiner—Anthony Dinkins
Attorney, Agent, or Firm—Arthur J. Samodovitz

[57] ABSTRACT

A multi-layer printed circuit board comprises a first metallic layer, a first Ta or Hf layer on one face of the first metallic layer, a first layer of $Ta_2O_5$ or HfO on a face of the Ta or Hf layer opposite the first metallic layer, a second metallic layer on the $Ta_2O_5$ or HfO layer opposite the Ta or Hf layer, a first dielectric layer on the first metallic layer opposite the Ta of Hf layer, and a second dielectric layer on the second metallic layer opposite the $Ta_2O_5$ or HfO layer. A multi-layer printed circuit board is formed by adding the following layers to form the second capacitor. A third metallic layer on said second dielectric layer, a second Ta or Hf layer on a face of the third metallic layer, a second $Ta_2O_5$ or HfO layer on a face of the second Ta or Hf layer opposite the third metallic layer, a fourth metallic layer on the second $Ta_2O_5$ or HfO layer opposite the second Ta or Hf layer, and a third dielectric layer on the fourth metallic layer opposite the second $Ta_2O_5$ or HfO layer.

22 Claims, 4 Drawing Sheets ns, 5,745,334

CAPACITOR FORMED WITHIN PRINTED CIRCUIT BOARD

BACKGROUND OF THE INVENTION

The present invention relates generally to printed circuit boards, and deals more particularly with a capacitor formed within a printed circuit board.

Printed circuit boards are widely used today to mount and interconnect electrical components such as discrete resistors, discrete capacitors, transistors, digital circuits, etc. It is common for the printed circuit board to contain many layers. Typically most of the components are mounted on the surface. Some of the conductors used to interconnect the components are also printed on the surface. The inner layers are primarily used to interconnect the components through other conductors printed on these inner layers and conductive vias passing through the outer and inner layers. For complicated circuits, the surface area must be carefully allocated to fit the many requisite components. Also, it is desirable to position some of the capacitors near to other, associated components to minimize path length and thereby minimize parasitic inductance.

It was also previously known to form a discrete capacitor from a bottom aluminum electrode, a next layer of tantalum (Ta), a next layer of $Ta_2O_5$ serving as a dielectric, and a top electrode layer. This capacitor was mounted on the surface of a substrate, and two conductive vias passed through the substrate to connect to the two electrodes. This capacitor was not part of a printed circuit board, but instead was a surface component on a substrate.

To conserve surface area of a printed circuit board, it may be desirable to form some of the capacitors within the printed circuit board. This will reduce demands on the surface area and also permit a capacitor to be located near to an associated component, if there is no space available on the surface near to this component.

Various techniques were previously known to form a capacitor within a printed circuit board. See for example, U.S. Pat. Nos. 5,079,069 and 5,161,086. While theses techniques may be effective in their respective printed circuit boards and for their respective applications, further improvements are desirable to provide a high amount of capacitance per amount of inner layer area utilized, provide a fabrication process with acceptable cost and complexity and provide a fabrication process which is compatible with the requisite printed circuit board materials, such as epoxy, polyimide or Teflon polymers and polymer impregnated glass cloth or fiber laminate materials and the like. Epoxy resins typically have glass transition temperatures from about 120° C. to about 190° C. and thermal decomposition temperatures from about 300° C. to about 375° C. Epoxy resins will withstand short duration exposures above the glass transition temperature, but will not withstand temperature excursions above the thermal decomposition temperature. For example, the fabrication process required for the capacitor cannot require so much heat or harsh chemicals as to degrade the printed circuit board materials.

SUMMARY OF THE INVENTION

The invention resides in a multi-layer printed circuit board comprising a first metallic layer, a first Ta or Hf layer on one face of the first metallic layer, a first layer of $Ta_2O_5$ or HfO on a face of the Ta or Hf layer opposite the first metallic layer, a second metallic layer on the $Ta_2O_5$ or HfO layer opposite the Ta or Hf layer, a first dielectric layer on the first metallic layer opposite the Ta of Hf layer, and a second dielectric layer on the second metallic layer opposite the $Ta_2O_5$ or HfO layer. These layers form a capacitor.

In accordance with one feature of the present invention, a dual capacitor is formed by adding the following layers to form the second capacitor. A third metallic layer on said second dielectric layer, a second Ta or Hf layer on a face of the third metallic layer, a second $Ta_2O_5$ or HfO layer on a face of the second Ta or Hf layer opposite the third metallic layer, a fourth metallic layer on the second $Ta_2O_5$ or HfO layer opposite the second Ta or Hf layer, and a third dielectric layer on the fourth metallic layer opposite the second $Ta_2O_5$ or HfO layer.

DETAILED DESCRIPTION OF THE PREFERRED EMBODIMENTS

Figure 1A:
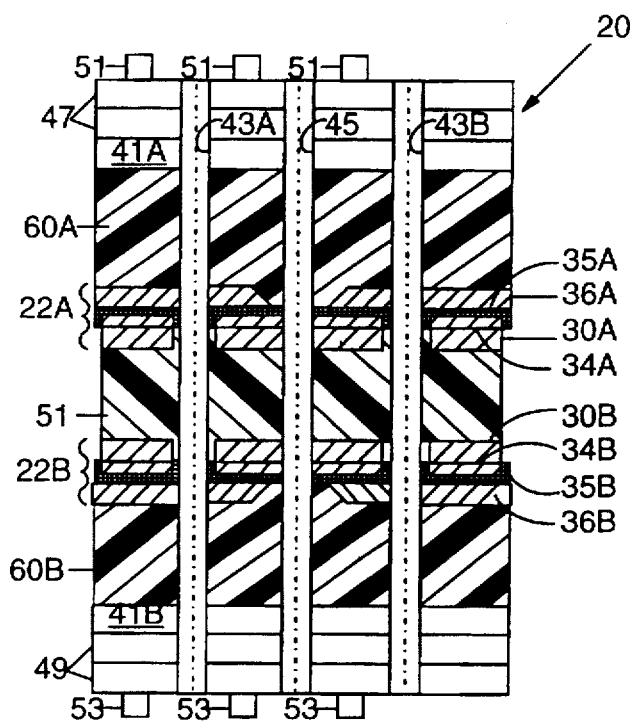
FIGS. 1(a) and 1(b) illustrate side cross-section and top views, respectively, of a printed circuit board including capacitors according to the present invention.
Figure 1B:
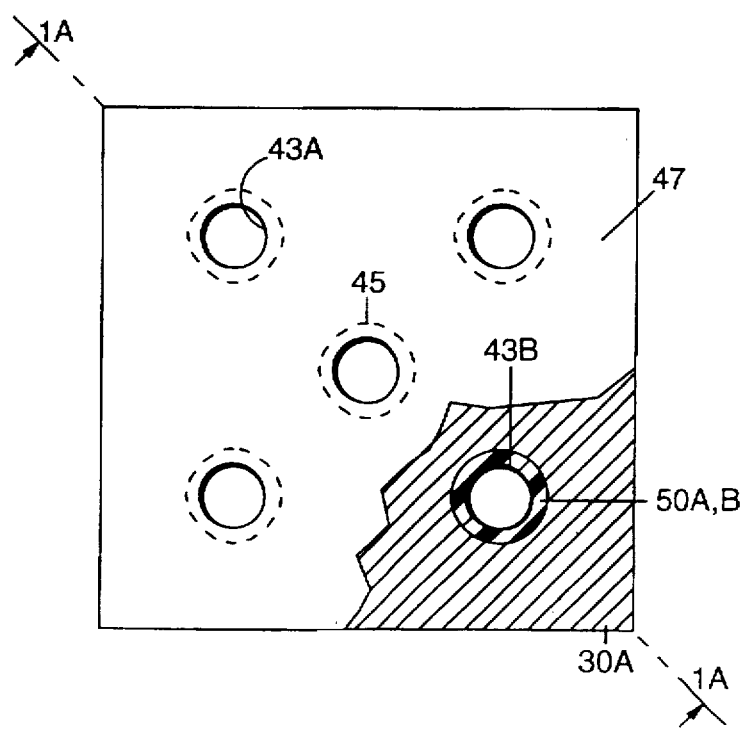

Referring now to the drawings in detail, wherein like reference numbers indicate like elements throughout, FIGS. 1(a,b) illustrate a printed circuit board generally designated 20 according to the present invention. Printed circuit board 20 comprises capacitors 22a and 22b. Capacitor 22a comprises an outer layer 30a of copper, an inner layer 34a of Tantalum (Ta) or Hafnium (Hf) in the pure metal form, i.e. unoxidized, another inner layer 35a of $Ta_2O_5$ or HfO, i.e. the oxidized form of the adjacent Ta or Hf layer, and another outer layer of copper 36a. By way of example, copper layer 30a is 25 microns thick, the nonoxidized layer 34a of Ta or Hf is 5 microns thick, the oxidized layer 35a of $Ta_2O_5$ or HfO is 0.1–2.0 microns thick and the copper layer 36a is 25 microns thick.

The oxidized layer 35a of $Ta_2O_5$ or HfO forms the dielectric material within capacitor 22a. The 0.5–2.0 micron thickness of the oxidized layer is desirable to provide high capacitance and dielectric breakdown greater than 50 volts. Copper layer 36a forms one plate of the capacitor, and the pure metal layer 34a of Ta or Hf in conjunction with copper layer 30a forms the other plate for the purpose of establishing the electric field and determining the overall capacitance. The overall capacitance of capacitor 22a depends on the thickness and dielectric constant of $Ta_2O_5$ or HfO and the overlapped areas of Ta or Hf layer 34a and copper layer 35a. For example, if the dielectric constant of $Ta_2O_5$ is 25 and the dielectric constant of HfO is 40, and the thickness is one micron, capacitor 22a will provide a capacitance of 22 nF per square cm plate area for the $Ta_2O_5$ capacitor and 35 nF per square cm plate area for the Hf capacitor as defined in the following parallel plate capacitor equation:

$$C = \frac{0.87 \times Er \times A}{t}$$

where C=capacitance (nF)
Er=dielectric constant
A=overlapped electrode area (square cm)
t=dielectric thickness (microns)

Copper layer 30a is included because the pure metal layer 34a of Ta or Hf has significant resistance. Thus, copper layer 30a serves as a backing electrode for the Ta or Hf layer 34a. With the copper layer 30a backing pure metal layer 34a of Ta or Hf, the resistive path length through the layer 34a is just the thickness of layer 34a. Because the thickness is small, the resultant resistance is negligible.

In the illustrated embodiment, capacitor 22b is identical to capacitor 22a with corresponding layers suffixed by "b" instead of "a".

In accordance with the present invention, capacitors 22a and 22b are encapsulated/laminated within layers 51, 60a and 60b of dielectric material. By way of example, the dielectric material comprises epoxy-glass, teflon or polyimide. Outer surfaces of layers 60a and 60b provide areas for respective metallic planes or printed conductors 41a,b. These planes or conductors 41a,b are electrically connected by copper vias 43a,b to capacitor plates 36a and 36b. Depending on the needs of the overall circuit, plates 36a and 36b can be connected by the planes or conductors 41a,b to ground, a voltage source or another component in the circuit as required. Preferably, plates 30a and 30b serve directly as the voltage or ground planes, while plates 36a and 36b serve directly as the alternate pair of the voltage or ground planes. A copper via 45 is electrically connected to copper plates 30a and 30b to connect capacitor 22a in parallel with capacitor 22b to double the resultant capacitance. (Alternately, the capacitors 22a and 22b can be connected separately in the circuit as needed.) Depending on the needs of the overall circuit, plates 30a and 30b can be connected by the via 45 to ground, a voltage source or another component in the circuit as required. In the illustrated example, plates 36a and 36b are connected to ground and plates 30a and 30b are connected to another voltage/power plane.

Printed circuit board 20 also comprises additional conductor or dielectric layers 47 and 49 outside of layers 41a and 41b, respectively to form the rest of the requisite circuit. These layers are formed by known techniques, the outer surfaces of printed circuit board 20 contain other circuit components 51, 53 and printed conductors as required, and layers 47 and 49 also contain other printed conductors, ground planes and vias as required. Such techniques are well known and understood in the industry.

Figure 2:
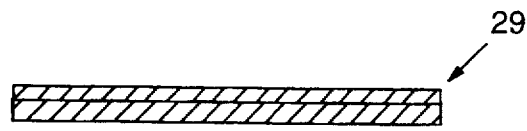
FIG. 2 illustrates a first step in the formation process of the printed circuit board of FIGS. 1(a) and 1(b).

FIGS. 2–6 illustrate sequential steps of a method for making printed circuit board 20 including capacitors 22a and 22b. First, as illustrated in FIG. 2, a dual layer, 29 is provided. Such a dual layer material can be purchased as such from commercial vendors such as Cabot Performance Materials, or formed by electrolytically plating copper 30a onto a pure Ta or Hf foil (34a). Alternately, Ta of Hf can be sputtered onto copper foil (30a). Ta and Hf are costly materials, and the sputtering technique can result in a minimum thickness of Ta or Hf, for example, 2 microns, required to subsequently form the dielectric material.

Figure 3:
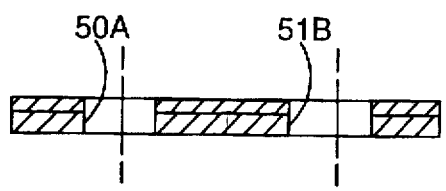
FIG. 3 illustrates a second step in the formation process of the printed circuit board of FIGS. 1(a) and 1(b).

FIG. 3 illustrates clearance holes 50a,b which have been drilled or punched through dual layer 30a,b or 34a,b to provide isolation/clearance for vias 43a,b so vias 43a,b do not make electrical contact with metallic layers 30a,b or 34a,b of capacitors 22a,b.

Figure 4:
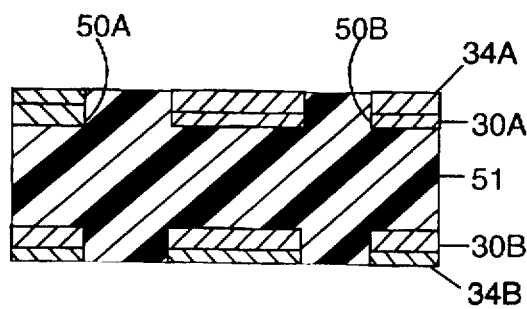
FIG. 4 illustrates a third step in the formation process of the printed circuit board of FIGS. 1(a) and 1(b).

FIG. 4 illustrates that both sets of dual layers 30a,34a and 30b,34b have been laminated with the application of heat and pressure to opposite surfaces of dielectric layer 51 such that layers 34a,b are exposed. Typical epoxy/glass lamination parameters would be a temperature of 190° C., a pressure of 500 psi, for a dwell time of 72 minutes.

Figure 5A:
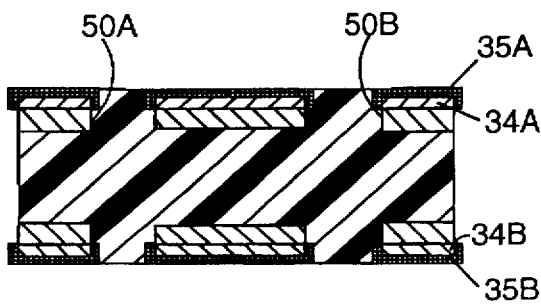
FIGS. 5(a) and 5(b) illustrate a fourth step in the formation process of the printed circuit board of FIGS. 1(a) and 1(b).
Figure 5B:
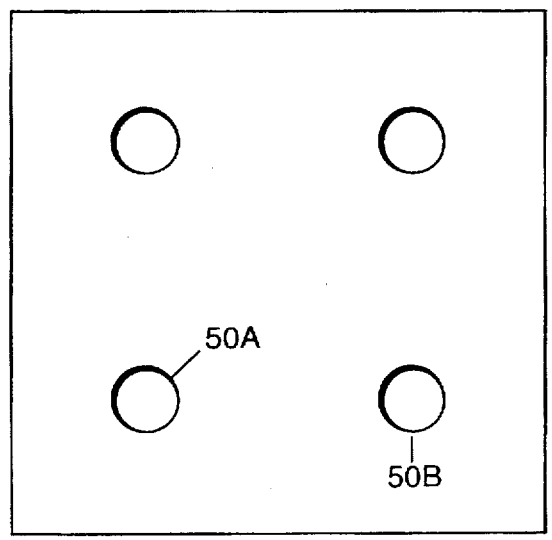

FIGS. 5(a,b) illustrate that $Ta_2O_5$ or HfO layers 35a,b have been formed on Ta or Hf layers 34a,b by known anodization or oxidation techniques. For example, Ta metal may be anodized in a room temperature bath of 0.5–2.0 percent by weight Ammonium Citrate, at a pH of 9, with an electrical current from 10–150 amps/square foot (ASF). This anodization process is described in "Metals Handbook" 9th Edition by American Society For Metals, Volume 5—Surface Cleaning, Finishing and Coating, pp663–665. Hf may by anodized in a solution of 45.4 volume percent ethanol, 26.5 volume percent water, 15.2 volume percent glycerine, 7.6 volume percent lactic acid, 3.8 volume percent phosphoric acid and 1.5 volume percent citric acid with an anodizing voltage of 200–300 volts. For most applications, the oxide layer $Ta_2O_5$ or HfO is formed after the foregoing lamination to dielectric layer 51. However, for some applications where the dielectric material or laminating substance cannot withstand the anodizing/oxidizing process required to form $Ta_2O_5$ or HfO, the anodizing/oxidizing process can be performed before dual layers 30a,34a and 30b,34b have been laminated, i.e. in the stage illustrated in FIG. 3.

Figure 6A:
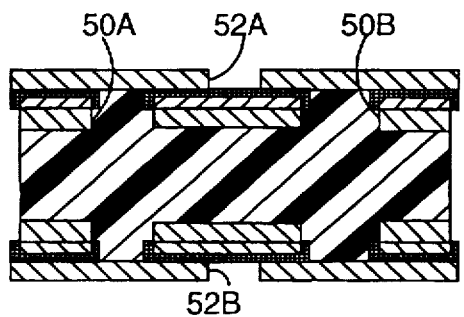
FIGS. 6(a) and 6(b) illustrate a fifth step in the formation process of the printed circuit board of FIGS. 1(a) and 1(b).
Figure 6B:
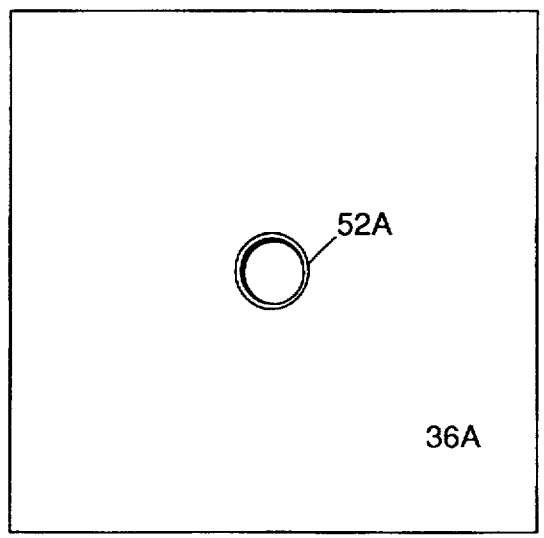

FIGS. 6(a,b) illustrate that copper electrodes 36a,b have been formed over oxide layers 35a,b, respectively, by copper or chromium/copper sputter seeding or Pd chemical seeding, followed by electrolytic copper plating (full copper plating or pattern copper plating) to the desired thickness. FIGS. 6(a,b) also illustrate that clearance holes 52a,b have been formed through the pure copper electrodes 36a,b (to subsequently provide clearance for via 45). If the copper electrodes were formed by full copper plating then subtractive etching is used to form the holes 52a,b. However, if the copper electrodes 36a,b were formed by pattern copper plating then flash etching is used to form the holes 52a,b. At this point in the process, two separate capacitors, capacitor 22a (comprising layers 30a, 34a, 35a and 36a) and capacitor 22b (comprising layers 30b, 34b, 35b and 36b) have been formed on opposite faces of dielectric material 51. In addition to providing the etched clearance holes (52a,b), isolation channels (not shown) can be etched at the same time. This isolation would be used to define a specific electrode area for providing discrete capacitor elements of a specific value within the larger printed circuit board area.

The dual capacitor sub-laminate of FIG. 6 may contain clearance holes 50a,b and 52a,b in a pre-defined location or pattern for use with a specific pre-determined interconnection scheme. Preferably, clearance holes 50a,b are provided in a standard grid pattern, for example, 25, 50 or 100 mil grid. This standard grid will allow the use of one standard grid pattern, dual capacitor sub-laminate, within many different interconnect schemes. By way of example, a dual capacitor sub-laminate with holes 50a,b drilled on a 100 mil grid (holes drilled in an array where a hole is drilled at every 0.100 inch center in x and y directions) and blanket copper 36a,b is provided. Clearance holes in layers 36a,b would then be defined in specific locations based on the predetermined interconnect scheme. Interconnections to layers 30a,b are made at any location off the 100 mil grid (i.e., at location 52a,b). Interconnections to layers 36a,b are made at any location on the 100 mil grid (i.e. location 50a,b). When an isolated through via or hole is required, it is made at any location on the 100 mil grid where a hole 52a,b in layers 36a,b has been defined at the same location as hole 50a,b.

FIGS. 1(a,b) illustrate that additional dielectric layers 60a,b have been laminated on the exposed surfaces of electrodes 36a,b, respectively, to create additional layers of the printed circuit board 20. The outer surfaces of layers 60a,b are now available for printed conductors or components. The outer surfaces of layers 60a,b are covered by copper foil 41a,b to form ground, signal or voltage planes and the other outer surfaces 47,49 of printed circuit board 20 contain circuit components. FIGS. 1(a,b) also illustrate that holes 43a,b and 45 are drilled entirely through the composite. Then, the holes are plated and surface layers etched to electrically connect capacitors 22a and 22b in parallel.

Additional printed circuit board layers, additional vias and printed conductors are added as required and components 51 and 53 are mounted on the outer surfaces to provide the final form of printed circuit board 20 as illustrated in FIGS. 1(a,b).

Based on the foregoing, a capacitor and method for making same have been disclosed according to the present invention. However, numerous modifications and substitutions can be made without deviating from the scope of the present invention. For example, the $Ta_2O_5$ or HfO can be formed by simple oxidation requiring heating of the Ta or Hf to 360° C. in an oxygen environment for 3 to 4 hours. Oxidation of the Ta or Hf metal may also be performed in a gaseous oxygen plasma system. Additionally, a $Ta_2O_5$ or HfO layer may be directly deposited by reactive DC sputtering techniques. It may also be desirable to thermally anneal the oxide films prepared by any of the aforementioned techniques to achieve desired dielectric constant and/or other desired dielectric properties. Rapid Thermal Annealling (RTA) is typically used for this type of annealling. Any of the above mentioned elevated temperature oxidation or annealling processes would be performed on the unlaminated Cu/Ta or Cu/Hf foil at the state shown in FIG. 3. This insures that there is no thermal degradation to dielectric 51 of FIG. 4, and further, will provide oxidation of the sidewalls of holes 50a,b. For long term capacitor stability, it may be necessary to provide barrier metallurgies (i.e., nickel or chrome) between the Cu and Ta/Hf layers and $Ta_2O_5$/HfO and Cu layers. Also, if the initial Ta or Hf is sputtered or otherwise deposited very thinly, the entire thickness of the Ta or Hf can be anodized or oxidized whereby metallic layers 30a,b become the actual capacitor plates. Therefore, the present invention has been disclosed by way of illustration and not limitation, and reference should be made to the following claims to determine the scope of the present invention.

We claim:

1. A multi-layer printed circuit board comprising:

a first copper layer;

a Ta or Hf layer on one face of said first copper layer;

a $Ta_2O_5$ or HfO layer on a face of said Ta or Hf layer, respectively, opposite said first copper layer;

a second copper layer on said $Ta_2O_5$ or HfO layer opposite said Ta or Hf layer;

a first dielectric layer on said first copper layer opposite said Ta or Hf layer; and a second dielectric layer on said second copper layer opposite said $Ta_2O_5$ or HfO layer.

2. A multi-layer printed circuit board as set forth in claim 1 wherein all of said layers are integral with said printed circuit board and further comprising another layer of $Ta_2O_5$ or HfO layer on side edges of said Ta or HfO layer, respectively.

3. A multi-layer printed circuit board as set forth in claim 1 wherein said $Ta_2O_5$ or HfO layer is 0.1 to 2.0 microns thick.

4. A multi-layer printed circuit board as set forth in claim 1 wherein said Ta or Hf layer is 1 to 20 microns thick.

5. A multi-layer printed circuit board as set forth in claim 1 wherein said $Ta_2O_5$ or HfO layer is 0.1 to 2.0 microns thick, and said Ta or Hf layer is 1 to 20 microns thick.

6. A multi-layer printed circuit board comprising:

a first metallic layer;

a Ta or Hf layer on one face of said first metallic layer;

A $Ta_2O_5$ or HfO layer on a face of said Ta or Hf layer, respectively, opposite said first metallic a second metallic layer on said $Ta_2O_5$ or HfO layer opposite said Ta or Hf layer;

a first dielectric layer on said first metallic layer opposite said Ta or Hf layer;

a second dielectric layer on said second metallic layer opposite said $Ta_2)_5$ or HfO layer;

a first conductive via which passes through said first or second dielectric layer and makes electrical contact with said first metallic layer but not said second metallic layer; and a second conductive via which passes through said first or second dielectric layer and makes electrical contact with said second metallic layer but not said first metallic layer.

7. A multi-layer printed circuit board as set forth in claim 6 wherein:

said first conductive via also passes through said second metallic layer, said Ta or Hf layer and said $Ta_2O_5$ or HfO layer; and said second conductive via also passes through said first metallic layer, said Ta or Hf layer and said $Ta_2O_5$ or HfO layer.

8. A multi-layer printed circuit board comprising:

a first metallic layer;

a first Ta or Hf layer on a face of said first metallic layer;

a first $Ta_2O_5$ or HfO layer on a face of said first Ta or Hf layer, respectively, opposite said first metallic layer;

a second metallic layer on said $Ta_2O_5$ or HfO layer opposite said first Ta or Hf layer;

a first dielectric layer on said first metallic electrode layer opposite said first Ta of Hf layer;

a second dielectric layer on said second metallic layer opposite said $Ta_2O_5$ or HfO layer;

a third metallic layer on said second dielectric layer opposite said second metallic layer;

a second Ta or Hf layer on a face of said third metallic layer opposite said second dielectric layer;

a second $Ta_2O_5$ or HfO layer on a face of said second Ta or Hf layer, respectively, opposite said third metallic layer;

a fourth metallic layer on said second $Ta_2O_5$ or HfO layer opposite said second Ta or Hf layer; and a third dielectric layer on said fourth metallic layer opposite said second $Ta_2O_5$ or HfO layer.

9. A multi-layer printed circuit board as set forth in claim 8 wherein said first metallic layer, said first Ta or Hf layer, said first $Ta_2O_5$ or HfO layer, and said second metallic layer form a first capacitor, and said third metallic layer, said second Ta or Hf layer, said second $Ta_2O_5$ or HfO layer, and said fourth metallic layer form a second capacitor, and further comprising a conductor connected between said first or second metallic layer and said third or fourth metallic layer to connect said first and second capacitors in parallel with each other.

10. A multi-layer printed circuit board as set forth in claim 8 wherein said $Ta_2O_5$ or HfO layer is 0.1 to 2.0 microns thick, and said Ta or Hf layer is 1 to 20 microns thick.

11. A multi-layer printed circuit board as set forth in claim 8 wherein all of said layers are integral with said printed circuit board and further comprising a third $Ta_2O_5$ or HfO layer on side edges of said first Ta or Hf layer, respectively, and a fourth $Ta_2O_5$ or HfO layer on side edges of said second Ta or Hf layer, respectively.

12. A multi-layer printed circuit board as set forth in claim 8 wherein said first, second, third and fourth metallic layers are all copper layers.

13. A multi-layer printed circuit board comprising:

a first metallic layer;

a first Ta or Hf layer on a face of said first metallic layer;

a first $Ta_2O_5$ or HfO layer on a face of said first Ta or Hf layer, respectively, opposite said first metallic layer;

a second metallic layer on said $Ta_2O_5$ or HfO layer opposite said first Ta or Hf layer;

a first dielectric layer on said first metallic electrode layer opposite said first Ta of Hf layer;

a second dielectric layer on said second metallic layer opposite said $Ta_2O_5$ or Hf layer;

a third metallic layer on said second dielectric layer opposite said second metallic layer;

a second Ta or Hf layer on a face of said third metallic layer opposite said second dielectric layer;

a second $Ta_2O_5$ or HfO layer on a face of said second Ta or Hf layer, respectively, opposite said third metallic layer;

a fourth metallic layer on said second $Ta_2O_5$ or HfO layer opposite said second Ta or Hf layer;

a third dielectric layer on said fourth metallic layer opposite said second $Ta_2O_5$ or HfO layer;

a first conductive via passing through all of said layers and making an electrical connection to said first and fourth metallic layers but not said second or third metallic layers; and a second conductive via passing through all of said layers and making an electrical connection to said second and third metallic layers but not said first or fourth metallic layers.

14. A multi-layer printed circuit board as set forth in claim 13 further comprising:

a fifth metallic layer on said first dielectric layer opposite said first metallic layer and electrically connected to one of said conductive vias; and a sixth metallic layer on said third dielectric layer opposite said fourth metallic layer and electrically connected to the other conductive via.

15. A multi-layer printed circuit board comprising:

first and second, parallel copper layers;

a $Ta_2O_5$ or HfO layer sandwiched between and intimately connected to both said first and second copper layers, whereby there is no Ta or Hf layer between said first and second copper layers;

a first dielectric layer on said first copper layer opposite said $Ta_2O_5$ or HfO layer; and a second dielectric layer on said second copper layer opposite said $Ta_2O_5$ or HfO layer.

16. A multi-layer printed circuit board as set forth in claim 15 wherein all of said layers are internal to said printed circuit board.

17. A multi-layer printed circuit board as set forth in claim 15 wherein said $Ta_2O_5$ or HfO layer is 0.1 to 2.0 microns thick.

18. A multi-layer printed circuit board comprising:

a first copper layer;

an Hf layer on one face of said first copper layer;

an HfO layer on a face of said Hf layer opposite said first copper layer;

a second copper layer on said HfO layer opposite said Hf layer;

a first dielectric layer on said first copper layer opposite said Hf layer; and a second dielectric layer on said second copper layer opposite said HfO layer.

19. A multi-layer printed circuit board as set forth in claim 18 further comprising a layer of HfO on side edges of said Hf layer.

20. A multi-layer printed circuit board comprising:

a first metallic layer;

a Ta layer on one face of said first metallic layer;

a first $Ta_2O_5$ layer on a face of said Ta layer opposite said first metallic layer;

a second $Ta_2O_5$ layer on side edges of said Ta layer;

a second metallic layer on said first $Ta_2O_5$ layer opposite said Ta layer;

a first dielectric layer on said first metallic layer opposite said Ta layer; and a second dielectric layer on said second metallic layer opposite said first $Ta_2O_5$ layer.

21. A multi-layer printed circuit board comprising:

first and second, parallel highly-conductive metallic layers;

a $Ta_2O_5$ layer sandwiched between and intimately connected to both said first and second metallic layers, whereby there is no Ta layer between said first and second metallic layers;

a first dielectric layer on said first metallic layer opposite said $Ta_2O_5$ layer; and a second dielectric layer on said second metallic layer opposite said $Ta_2O_5$ layer; and wherein all of said layers are internal to said printed circuit board.

22. A multi-layer printed circuit board comprising:

first and second, parallel highly-conductive metallic layers;

an HfO layer sandwiched between and intimately connected to said first and second metallic layers, whereby there is no Hf layer between said first and second metallic layers;

a first dielectric layer on said first metallic layer opposite said HfO layer; and a second dielectric layer on said second metallic layer opposite said HfO layer; and wherein all of said layers are internal to said printed circuit board.

* * * * *

UNITED STATES PATENT AND TRADEMARK OFFICE
CERTIFICATE OF CORRECTION

PATENT NO. : 5,745,334
DATED : 04/28/98
INVENTOR(S) : J. G. Hoffarth et al

It is certified that error appears in the above-indentified patent and that said Letters Patent is hereby corrected as shown below:

Column 6, line 7 - delete ":" and insert --;--;
          line 10 - after "metallic" to read --metallic layer--.
          line 16 - delete "$Ta_{2)5}$" and insert --$Ta_2O_5$--

Column 7, line 17 - delete ":" and insert --;--.

Signed and Sealed this

Second Day of February, 1999

Attest:

Attesting Officer

Acting Commissioner of Patents and Trademarks